United States Patent
Huang et al.

(10) Patent No.: US 8,049,321 B2
(45) Date of Patent: Nov. 1, 2011

(54) SEMICONDUCTOR DEVICE ASSEMBLY AND METHOD THEREOF

(75) Inventors: Yin-Chao Huang, Taipei Hsien (TW); Shi-Bai Chen, Hsinchu County (TW); Kang-Wei Hsueh, Hsinchu (TW); Hung-Sung Li, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 282 days.

(21) Appl. No.: 12/396,450

(22) Filed: Mar. 2, 2009

(65) Prior Publication Data

US 2009/0294944 A1 Dec. 3, 2009

Related U.S. Application Data

(60) Provisional application No. 61/057,211, filed on May 30, 2008, provisional application No. 61/057,880, filed on Jun. 2, 2008.

(51) Int. Cl.
*H01L 23/02* (2006.01)

(52) U.S. Cl. .......... 257/686; 257/E21.499; 257/E23.068
(58) Field of Classification Search .................. 257/686, 257/E21.499, E23.068
See application file for complete search history.

(56) References Cited

U.S. PATENT DOCUMENTS

| 5,789,816 | A | 8/1998 | Wu |
| 6,472,747 | B2 | 10/2002 | Bazarjani |
| 6,882,034 | B2 | 4/2005 | Corisis et al. |
| 6,995,043 | B2 | 2/2006 | Corisis et al. |
| 2010/0013074 | A1* | 1/2010 | Corisis et al. .................. 257/686 |
| 2010/0255637 | A1* | 10/2010 | Ishida et al. .................. 438/109 |

FOREIGN PATENT DOCUMENTS

| CN | 1498423 A | 5/2004 |
| JP | 6232196 | 8/1994 |

* cited by examiner

*Primary Examiner* — David S Blum
(74) *Attorney, Agent, or Firm* — Winston Hsu; Scott Margo

(57) ABSTRACT

A semiconductor device assembly includes a first semiconductor die, a second semiconductor die, at least one semiconductor package component or another semiconductor die, a first conductive element and a second conductive element. The first semiconductor die includes at least one bonding pad. The second semiconductor die includes a bonding pad module. The first conductive element is coupled between the bonding pad module of the second semiconductor die and the bonding pad of the first semiconductor die, and the second conductive element is coupled between the bonding pad module of the second semiconductor die and the semiconductor package component or the another semiconductor die, wherein the first semiconductor die is coupled to the semiconductor package component or the another semiconductor die via the bonding pad and the bonding pad module and the first and second conductive elements.

15 Claims, 14 Drawing Sheets

SEMICONDUCTOR DEVICE ASSEMBLY AND METHOD THEREOF

CROSS REFERENCE TO RELATED APPLICATIONS

This application claims the priority of U.S. Provisional Application No. 61/057,211, filed May 30, 2008, and the priority of U.S. Provisional Application No. 61/057,880, filed Jun. 2, 2008, which are included herein by references.

BACKGROUND OF THE INVENTION

The present invention relates to a semiconductor device assembly, and more particularly, to a semiconductor device assembly including semiconductor dies, where one semiconductor die is coupled to package components or another semiconductor die via the other semiconductor die.

When a semiconductor die is packaged, wires are used to connect bonding pads of the semiconductor die and package components (e.g., leads of a lead frame) to allow communication between the bonding pads and the semiconductor package components. In addition, designs of the wiring connection between the bonding pads and the semiconductor package components, such as a length of each wire and a distance between two adjacent wires, need to satisfy the routing rule.

Regarding a semiconductor device assembly, such as multi-chip module (MCM), that combines the functionalities of two or more semiconductor dies in a package, however, because many semiconductor dies are arranged in a package, in order to satisfy the routing rule, designs of the semiconductor dies may be more complex.

SUMMARY OF THE INVENTION

It is therefore an objective of the present invention to provide a semiconductor device assembly including semiconductor dies, where one semiconductor die is coupled to a semiconductor package component or another semiconductor die via the other semiconductor die, to solve the above-mentioned problems.

According to one embodiment of the present invention, a semiconductor device assembly comprises a first semiconductor die, a second semiconductor die, at least one semiconductor package component or another semiconductor die, a first conductive element and a second conductive element. The first semiconductor die comprises at least one bonding pad. The second semiconductor die comprises a bonding pad module. The first conductive element is coupled between the bonding pad module of the second semiconductor die and the bonding pad of the first semiconductor die, and the second conductive element is coupled between the bonding pad module of the second semiconductor die and the semiconductor package component or the another semiconductor die, where the first semiconductor die is coupled to the semiconductor package component or the another semiconductor die via the bonding pad and the bonding pad module and the first and second conductive elements.

According to another embodiment of the present invention, a method for establishing electrical connections in a semiconductor device assembly comprises: providing a first semiconductor die comprising at least one bonding pad; providing a second semiconductor die comprising a bonding pad module; providing at least one semiconductor package component or another semiconductor die; positioning a first conductive element between the bonding pad module of the second semiconductor die and the bonding pad of the first semiconductor die; and positioning a second conductive element between the bonding pad module of the second semiconductor die and the semiconductor package component or the another semiconductor die; wherein the first semiconductor die is coupled to the semiconductor package component or the another semiconductor die via the bonding pad and the bonding pad module and the first and second conductive elements.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1A:
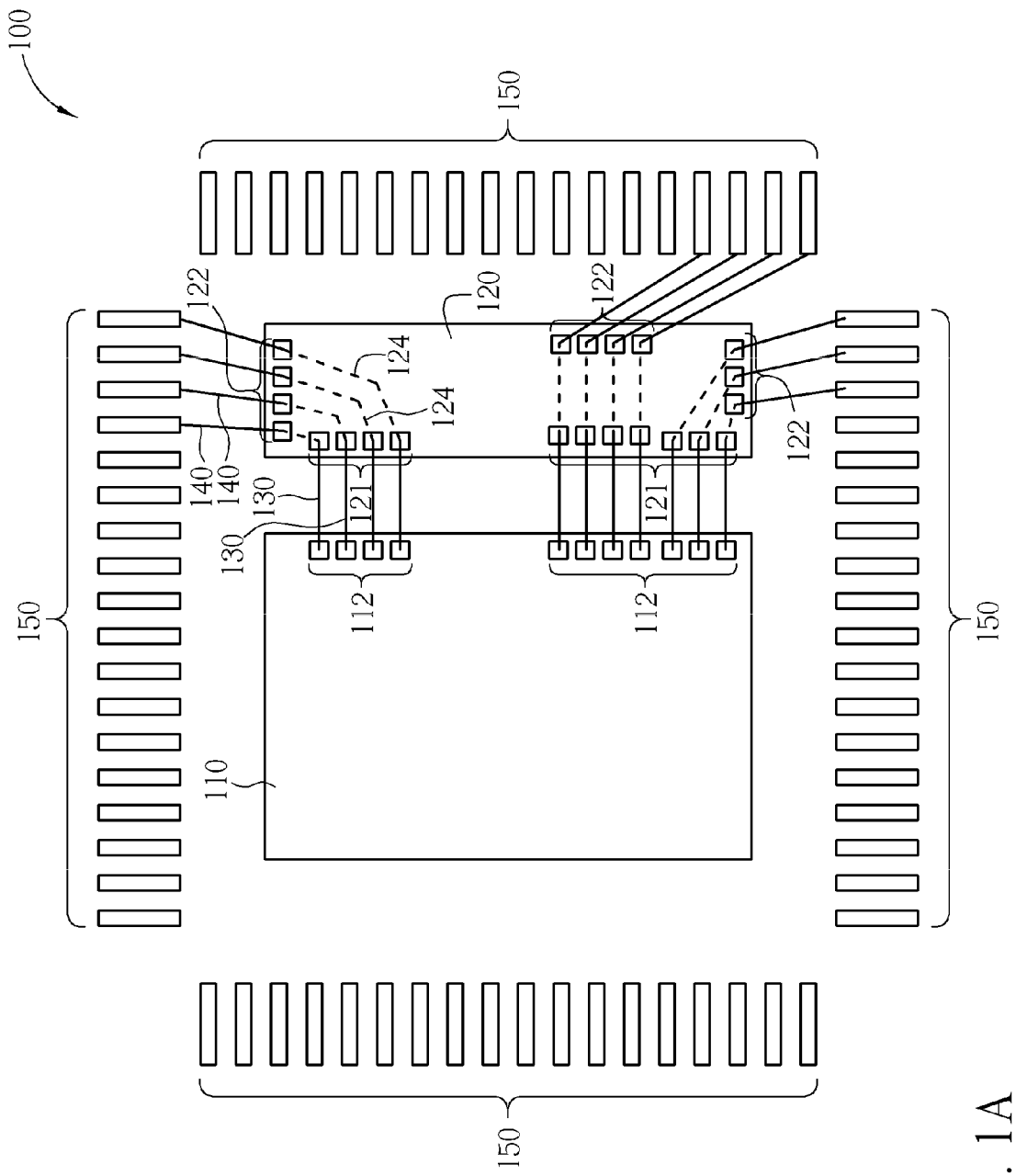
FIG. 1A is a diagram illustrating a semiconductor device assembly according to a first embodiment of the present invention.

Please refer to FIG. 1A. FIG. 1A is a diagram illustrating a semiconductor device assembly 100 according to a first embodiment of the present invention. The semiconductor device assembly 100 includes two semiconductor dies 110 and 120, a plurality of first conductive elements 130, a plurality of second conductive elements 140, and a plurality of semiconductor package components 150. The semiconductor die 110 includes a plurality of bonding pads 112. The semiconductor die 120 includes a bonding pad module including a plurality of first bonding pads 121 and second bonding pad 122, where the first and the second bonding pads 121 and 122 are coupled by conductive traces 124, respectively. In addition, the first and the second bonding pads 121 and 122 may be or not be coupled to a die core of the semiconductor die 120 via any conductive trace within the semiconductor die 120 according to different applications. For example, to allow signals input from the semiconductor package components 150 to be used by both the semiconductor dies 110 and 120, at least one of the first and the second bonding pads 121 and 122 may be coupled to a die core of the semiconductor die 120. In addition, the semiconductor dies 110 and 120 may be on or over a substrate (not shown), and the first and second conductive components 130 and 140 may be outside of the substrate.

The first conductive elements 130 are coupled between the bonding pads 112 of the semiconductor die 110 and the first bonding pad 121 of the semiconductor die 120, and the second conductive elements 140 are coupled between the second bonding pads 122 of the second semiconductor die 120 and the semiconductor package components 150. Therefore, the bonding pads 112 can communicate with the semiconductor package components 150 by way of the first and second bonding pads 121 and 122 of the semiconductor device 120. Thus the semiconductor die 110 may be coupled to the semiconductor package component 150 via the bonding pad 112 and the first and second bonding pads 121 and 122 included in the bonding pad module and the first and second conductive elements 130 and 140.

Figure 1B:
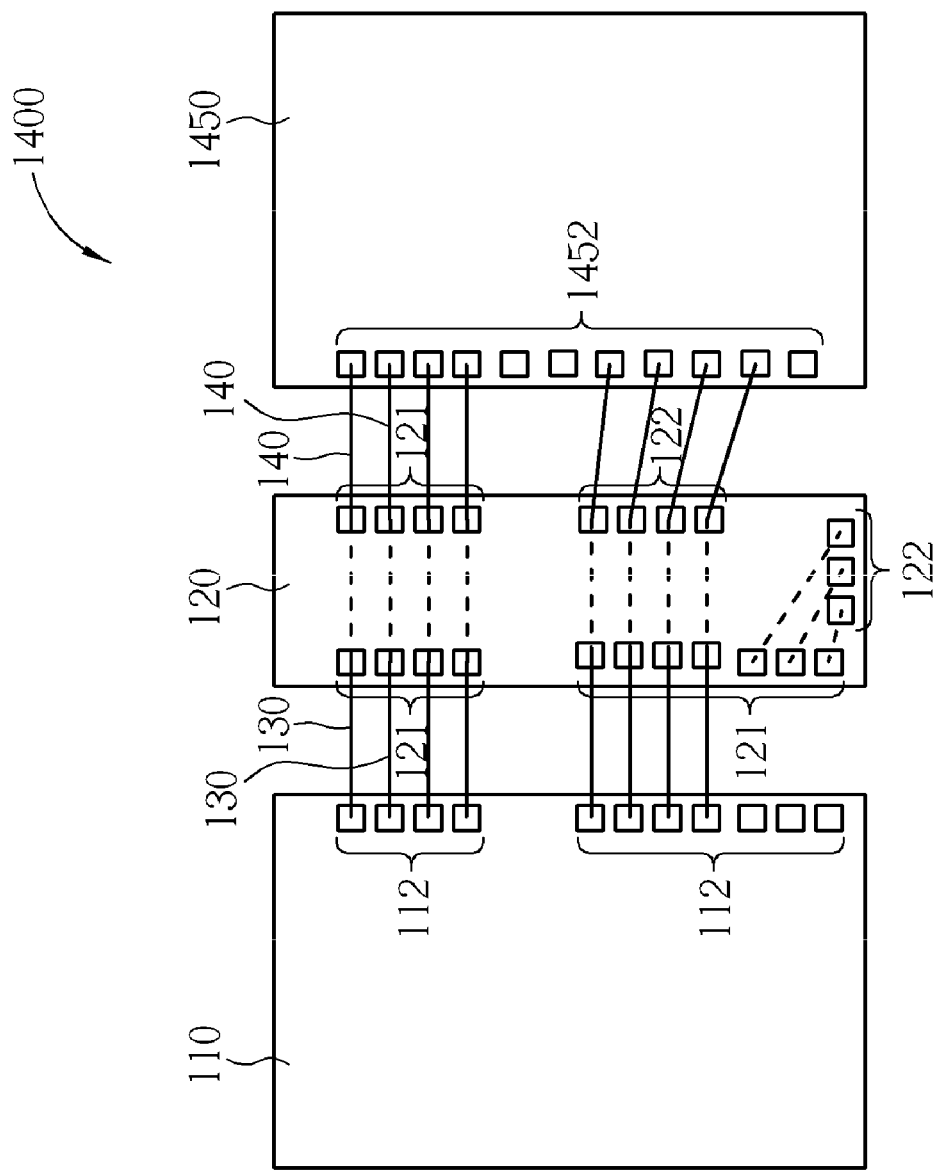
FIG. 1B is a diagram illustrating a semiconductor device assembly according to a second embodiment of the present invention.

In addition, in the semiconductor device assembly 100 shown in FIG. 1A, the semiconductor die 110 is coupled to the semiconductor package component 150 via the bonding pad module of the semiconductor die 120. However, in a second embodiment, a semiconductor device assembly 1400 shown in FIG. 1B, the semiconductor die 110 is coupled to another semiconductor die 1450 via the bonding pads 112, the bonding pad module of the semiconductor die 120, and bonding pads 1452 of the another semiconductor die 1450. Other portions of the semiconductor device assembly 1400 are similar to those of the semiconductor device assembly 100, therefore, further descriptions are omitted here.

In a related art package method, the bonding pads of the semiconductor die are coupled to their corresponding semiconductor package components by wires, which is similar to the wires being directly coupled between the bonding pads 112 of the semiconductor die 110 and the semiconductor package components 150. In the above related art package method, however, lengths of these wires or distances between two adjacent wires may not satisfy the routing rule, therefore, designs of the semiconductor dies may be more complex in order to satisfy the routing rule. In the semiconductor device assembly 100 of the present invention, the bonding pads 112 of the semiconductor die 110 can communicate with the semiconductor package components 150 by way of the semiconductor die 120, therefore, the designs of the semiconductor dies 110 and 120 are more flexible.

The semiconductor package components 150 can be leads of a lead frame or fingers of a ball grid array (BGA) substrate.

In addition, when the semiconductor device assembly 100 has different applications, (e.g., different specifications of TV or communication systems) the semiconductor dies 110 and 120 generally need to be re-designed several times to satisfy these different applications. In another embodiment of the present invention, the semiconductor die 120 can be designed to include common functions of all the applications. Therefore, only the semiconductor die 110 needs to be re-designed for different applications of the semiconductor device assembly 100. Furthermore, because the semiconductor die 120 includes the first and second pads 121 and 122 for allowing the semiconductor die 110 to communicate with the semiconductor package elements 150, re-designation of the semiconductor device assembly 100 is faster and more efficient.

In another embodiment of the present invention, one of the semiconductor dies 110 and 120 can be designed for executing digital signal processing and the other one can be designed for executing analog signal processing.

Figure 2:
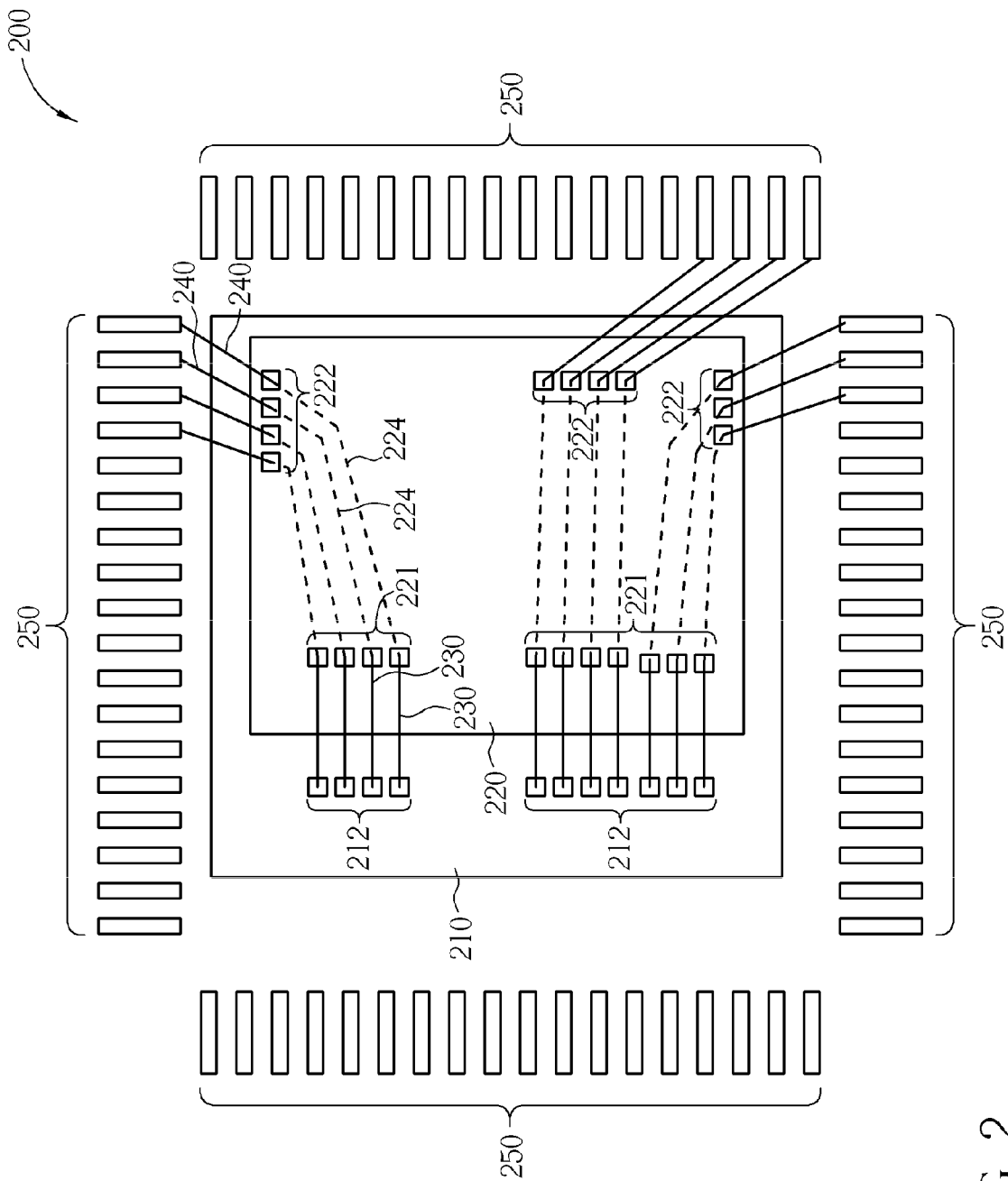
FIG. 2 is a diagram illustrating a semiconductor device assembly according to a third embodiment of the present invention.

FIG. 2 is a diagram illustrating a semiconductor device assembly 200 according to a third embodiment of the present invention. The semiconductor device assembly 200 includes two semiconductor dies 210 and 220, a plurality of first conductive elements 230, a plurality of second conductive elements 240, and a plurality of semiconductor package components 250. The semiconductor die 210 includes a plurality of bonding pads 212. The semiconductor die 220 includes a bonding pad module including a plurality of first bonding pads 221 and second bonding pad 222, where the first and the second bonding pads 221 and 222 are coupled by conductive traces 224, respectively. In addition, the first and the second bonding pads 221 and 222 may be or not be coupled to a die core of the semiconductor die 220 via any conductive trace within the semiconductor die 220 according to different applications. Additionally, the first conductive elements 230 are coupled between the bonding pads 212 of the semiconductor die 210 and the first bonding pads 221 of the semiconductor die 220, and the second conductive elements 240 are coupled between the second bonding pads 222 of the second semiconductor die 220 and the semiconductor package components 250. In addition, the semiconductor die 220 may be stacked on or over the semiconductor die 210. In addition, the semiconductor dies 210 and 220 may be on or over a substrate (not shown), and the first and second conductive elements 230 and 240 may be outside of the substrate.

Figure 3:
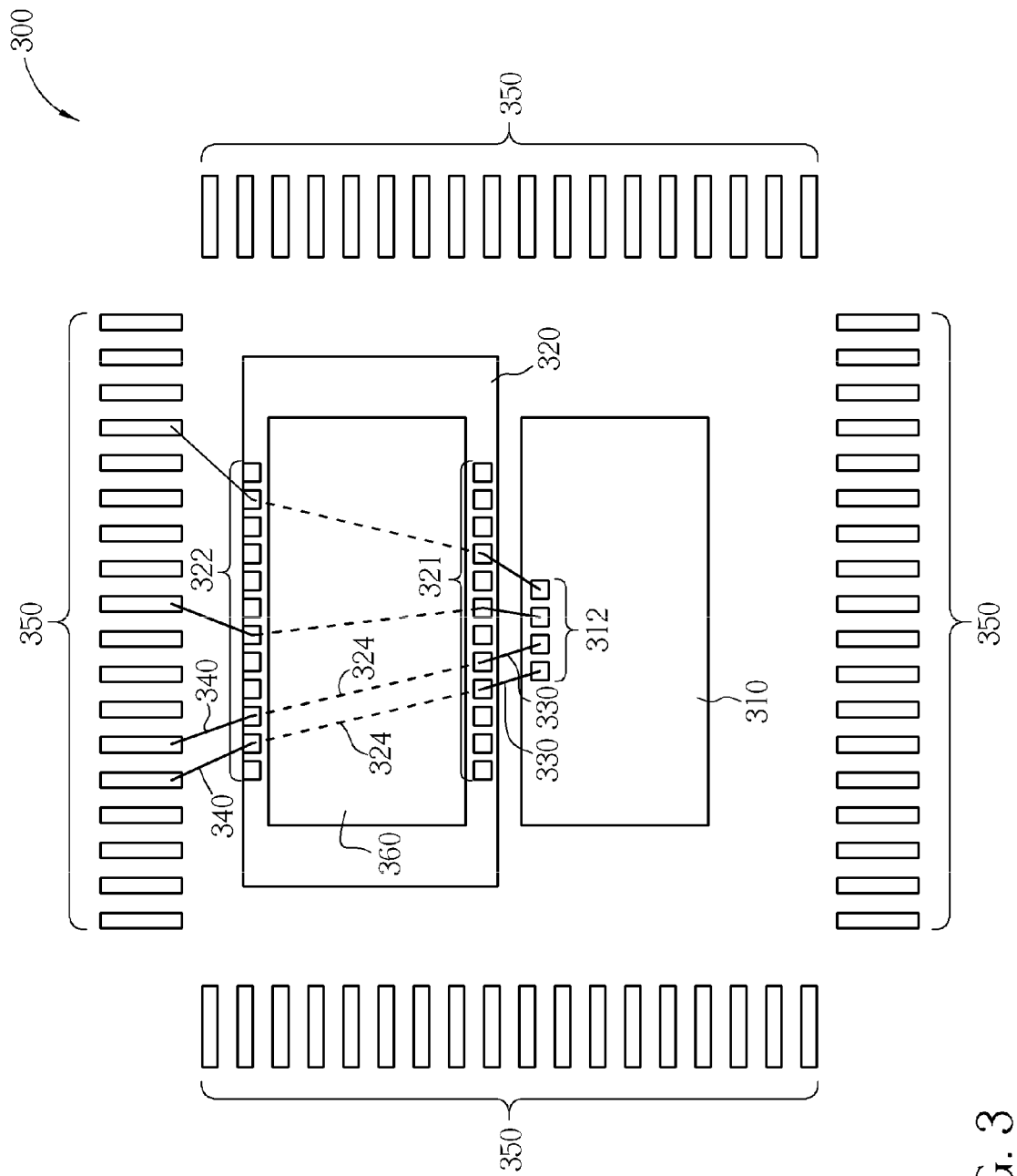
FIG. 3 is a diagram illustrating a semiconductor device assembly according to a fourth embodiment of the present invention.

FIG. 3 is a diagram illustrating a semiconductor device assembly 300 according to a fourth embodiment of the present invention. The semiconductor device assembly 300 includes three semiconductor dies 310, 320 and 360, a plurality of first conductive elements 330, a plurality of second conductive elements 340, and a plurality of semiconductor package components 350. The semiconductor die 310 includes a plurality of bonding pads 312. The semiconductor die 320 includes a bonding pad module including a plurality of first bonding pads 321 and second bonding pads 322, where the first and the second bonding pads 321 and 322 are coupled by conductive traces 324, respectively. In addition, the first and the second bonding pads 321 and 322 may be or not be coupled to a die core of the semiconductor die 320 via any conductive trace within the semiconductor die 320 according to different applications. Furthermore, the first conductive elements 330 are coupled between the bonding pads 312 of the semiconductor die 310 and the first bonding pads 321 of the semiconductor die 320, and the second conductive elements 340 are coupled between the second bonding pads 322 of the second semiconductor die 320 and the semiconductor package components 350. In addition, the semiconductor dies 310 and 320 may be side-by-side, and the semiconductor die 360 may be stacked on or over the semiconductor die 320. In addition, the semiconductor dies 310, 320 and 360 may be on or over a substrate (not shown), and the first and second conductive elements 330 and 340 may be outside of the substrate.

Figure 4:
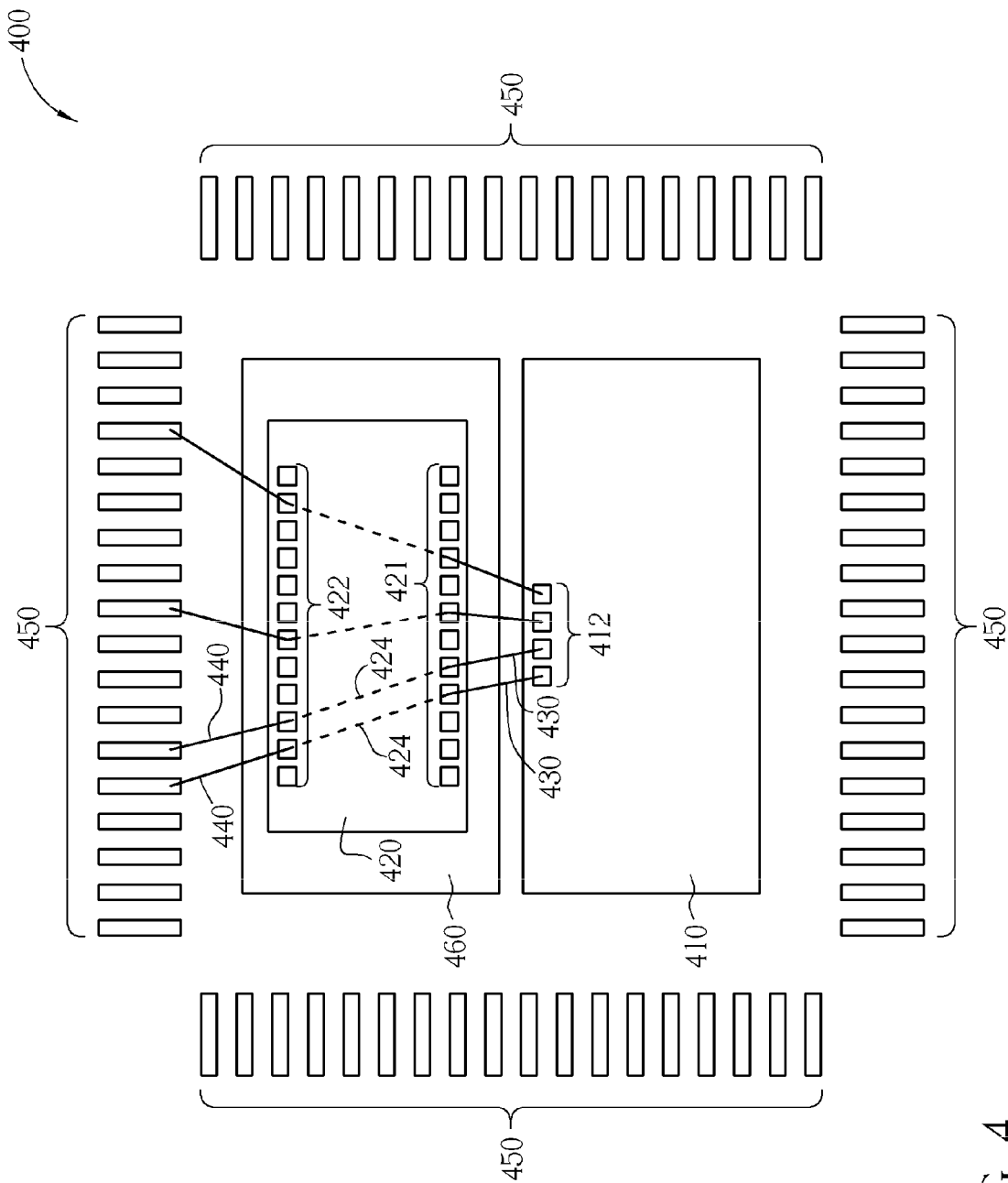
FIG. 4 is a diagram illustrating a semiconductor device assembly according to a fifth embodiment of the present invention.

FIG. 4 is a diagram illustrating a semiconductor device assembly 400 according to a fifth embodiment of the present invention. The semiconductor device assembly 400 includes three semiconductor dies 410, 420 and 460, a plurality of first conductive elements 430, a plurality of second conductive elements 440, and a plurality of semiconductor package components 450. The semiconductor die 410 includes a plurality of bonding pads 412. The semiconductor die 420 includes a bonding pad module including a plurality of first bonding pads 421 and second bonding pads 422, where the first and the second bonding pads 421 and 422 are coupled by conductive traces 424, respectively. In addition, the first and the second bonding pads 421 and 422 may be or not be coupled to a die core of the semiconductor die 420 via any conductive trace within the semiconductor die 420 according to different applications. Furthermore, the first conductive elements 430 are coupled between the bonding pads 412 of the semiconductor die 410 and the first bonding pads 421 of the semiconductor die 420, and the second conductive elements 440 are coupled between the second bonding pad 422 of the second semiconductor die 420 and the semiconductor package component 450. In addition, the semiconductor dies 410 and 460 may be side-by-side, and the semiconductor die 420 may be stacked on or over the semiconductor die 460. In addition, the semiconductor dies 410, 420 and 460 may be on or over a substrate (not shown), and the first and second conductive elements 430 and 440 may be outside of the substrate.

Figure 5:
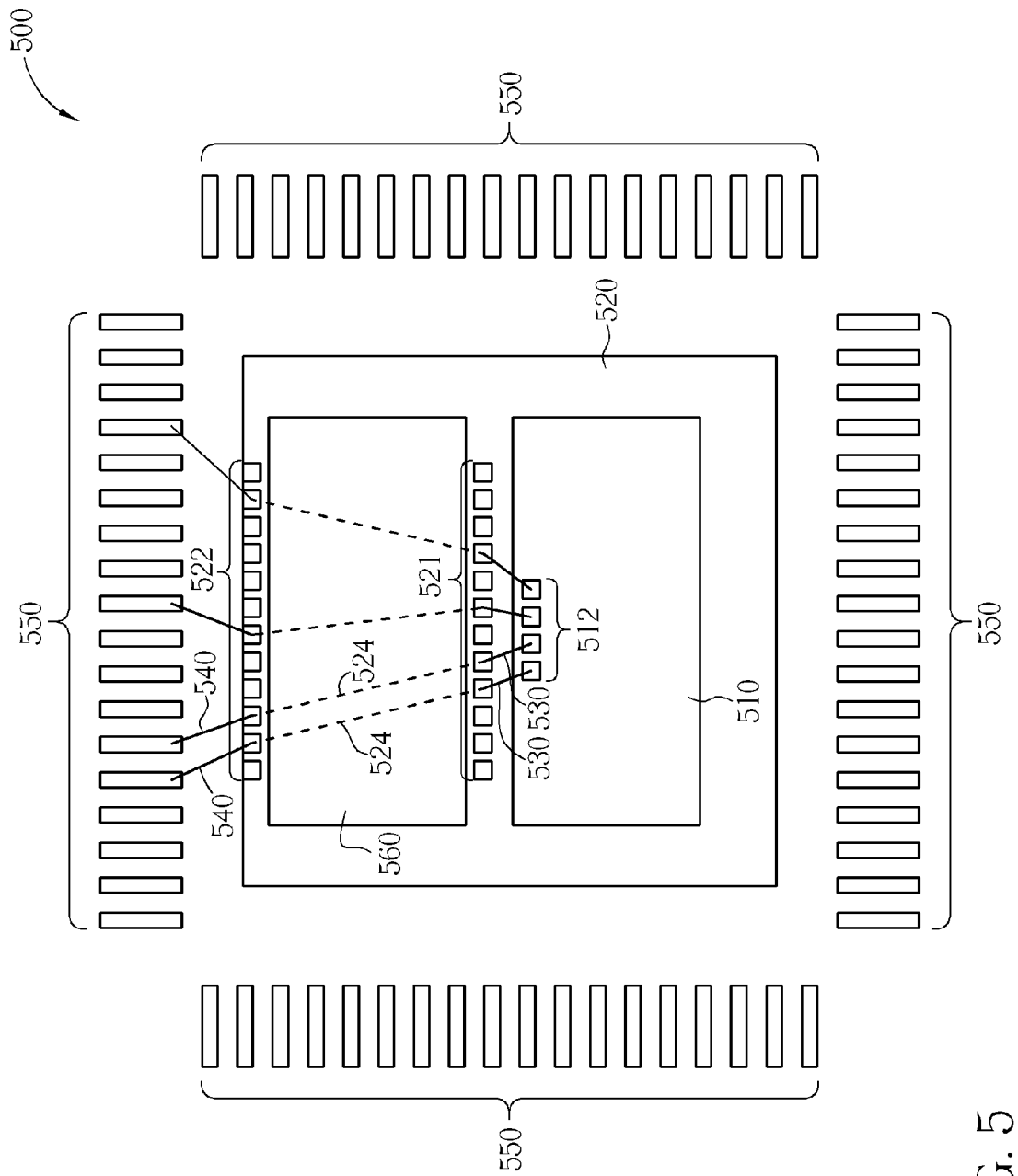
FIG. 5 is a diagram illustrating a semiconductor device assembly according to a sixth embodiment of the present invention.

FIG. 5 is a diagram illustrating a semiconductor device assembly 500 according to a sixth embodiment of the present invention. The semiconductor device assembly 500 includes three semiconductor dies 510, 520 and 560, a plurality of first conductive elements 530, a plurality of second conductive elements 540, and a plurality of semiconductor package components 550. The semiconductor die 510 includes a plurality of bonding pads 512. The semiconductor die 520 includes a bonding pad module including a plurality of first bonding pads 521 and second bonding pads 522, where the first and the second bonding pads 521 and 522 are coupled by conductive traces 524, respectively. In addition, the first and the second bonding pads 521 and 522 may be or not be coupled to a die core of the semiconductor die 520 via any conductive trace within the semiconductor die 520 according to different applications. Furthermore, the first conductive elements 530 are coupled between the bonding pads 512 of the semiconductor die 510 and the first bonding pads 521 of the semiconductor die 520, and the second conductive elements 540 are coupled between the second bonding pads 522 of the second semiconductor die 520 and the semiconductor package components 550. In addition, the semiconductor dies 510 and 560 may be stacked on or over the semiconductor die 520. In addition, the semiconductor dies 510, 520 and 560 may be on or over a substrate (not shown), and the first and second conductive elements 530 and 540 may be outside of the substrate.

Figure 6:
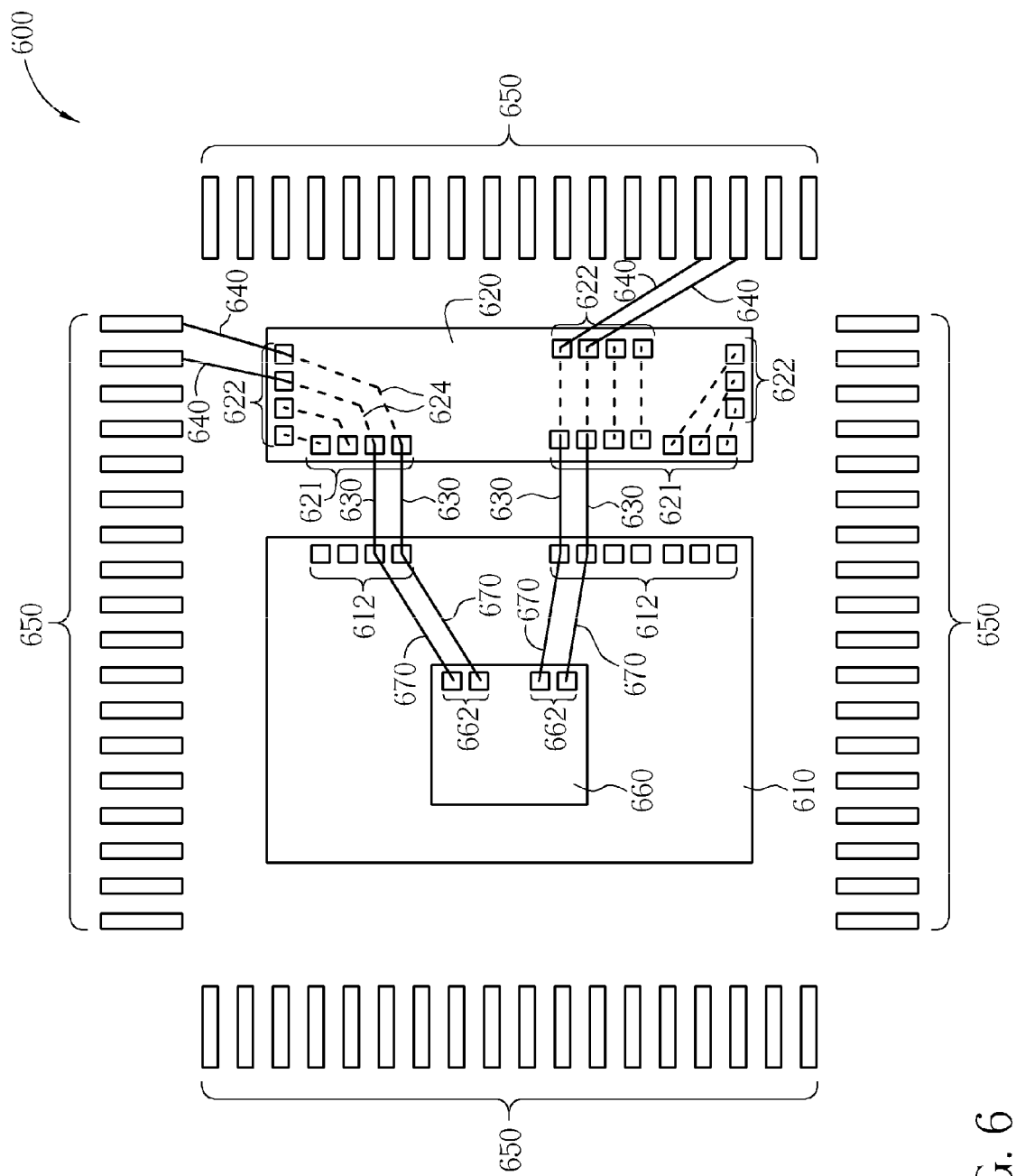
FIG. 6 is a diagram illustrating a semiconductor device assembly according to a seventh embodiment of the present invention.

It is noted that, in other embodiments of the present invention, the semiconductor package components 250, 350, 450 and 550 can be leads of a lead frame or fingers of a ball grid array (BGA) substrate. The semiconductor dies 210, 310, 410 and 510 may be utilized for executing digital signal processing, and the semiconductor dies 220, 320, 420 and 520 may be utilized for executing analog signal processing, or the semiconductor dies 210, 310, 410 and 510 may be utilized for executing analog signal processing, and the semiconductor dies 220, 320, 420 and 520 may be utilized for executing digital signal processing FIG. 6 is a diagram illustrating a semiconductor device assembly 600 according to a seventh embodiment of the present invention. The semiconductor device assembly 600 includes three semiconductor dies 610, 620 and 660, a plurality of first conductive elements 630, a plurality of second conductive elements 640, a plurality of third conductive elements 670, and a plurality of semiconductor package components 650. The semiconductor die 610 includes a plurality of bonding pads 612, where the bonding pads 612 may be or not be coupled to a die core of the semiconductor die 610 via any conductive trace within the semiconductor die 610 according to different applications. The semiconductor die 620 includes a bonding pad module including a plurality of first bonding pads 621 and second bonding pads 622, where the first and the second bonding pads 621 and 622 are coupled by conductive traces 624, respectively. In addition, the first and the second bonding pads 621 and 622 may not be coupled to a die core of the semiconductor die 620 via any conductive trace within the semiconductor die 620. In addition, the semiconductor dies 610 and 620 may be, but not limited to, side-by-side, and the semiconductor die 660 may be, but not limited to, stacked on or over the semiconductor die 610. In addition, the semiconductor dies 610, 620 and 660 may be on or over a substrate (not shown), and the first, second and third conductive elements 630, 640 and 670 may be outside of the substrate.

The first conductive elements 630 are coupled between the bonding pads 612 of the semiconductor die 610 and the first bonding pads 621 of the semiconductor die 620, the second conductive elements 640 are coupled between the second bonding pads 622 of the second semiconductor die 620 and the semiconductor package components 650, and the third conductive elements 670 are coupled between the bonding pads 662 of the semiconductor die 660 and the bonding pads 612 of the semiconductor die 610, respectively. Therefore, the bonding pads 662 can communicate with the semiconductor package components 650 by way of the bonding pads 612, 621 and 622.

In addition, in the semiconductor device assembly 600 shown in FIG. 6, the semiconductor dies 610 and 620 are side-by-side, and the semiconductor die 660 is stacked on or over the semiconductor die 610. However, in other embodiments of the present invention, one of the semiconductor dies 610 and 620 can be stacked on or over the other of the semiconductor dies 610 and 620; or, the semiconductor die 660 can be stacked on or over the semiconductor die 620. These alternative designs all fall in the scope of the present invention.

Figure 7:
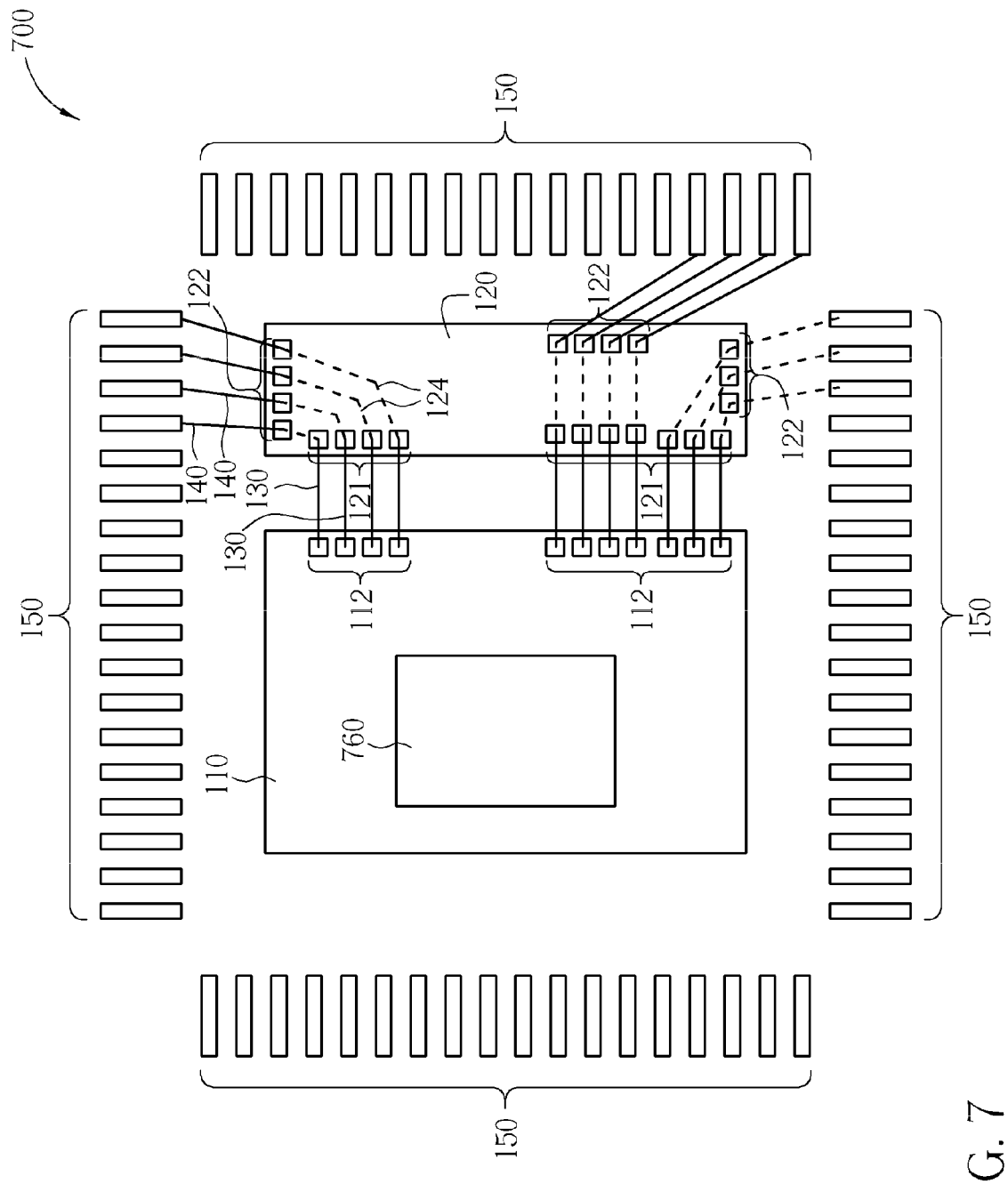
FIG. 7 is a diagram illustrating a semiconductor device assembly according to an eighth embodiment of the present invention.

FIG. 7 is a diagram illustrating a semiconductor device assembly 700 according to an eighth embodiment of the present invention. semiconductor device assembly 700 is similar to the semiconductor device assembly 100 shown in FIG. 1 by adding a semiconductor die 760 on or over the semiconductor die 110. In addition, in FIG. 7, the semiconductor die 760 is stacked on or over the semiconductor die 110, however, in other embodiment of the present invention, the semiconductor die 760 can also be positioned under the semiconductor die 110.

It is noted that, in other embodiments, the semiconductor package components in the semiconductor device assemblies 200-700 shown in FIGS. 2-7 can be replaced by another semiconductor die. Taking the device assembly 200 as an example, that is, the semiconductor die 210 may be coupled to the another semiconductor die via the bonding pad module of the semiconductor die 220.

Figure 8:
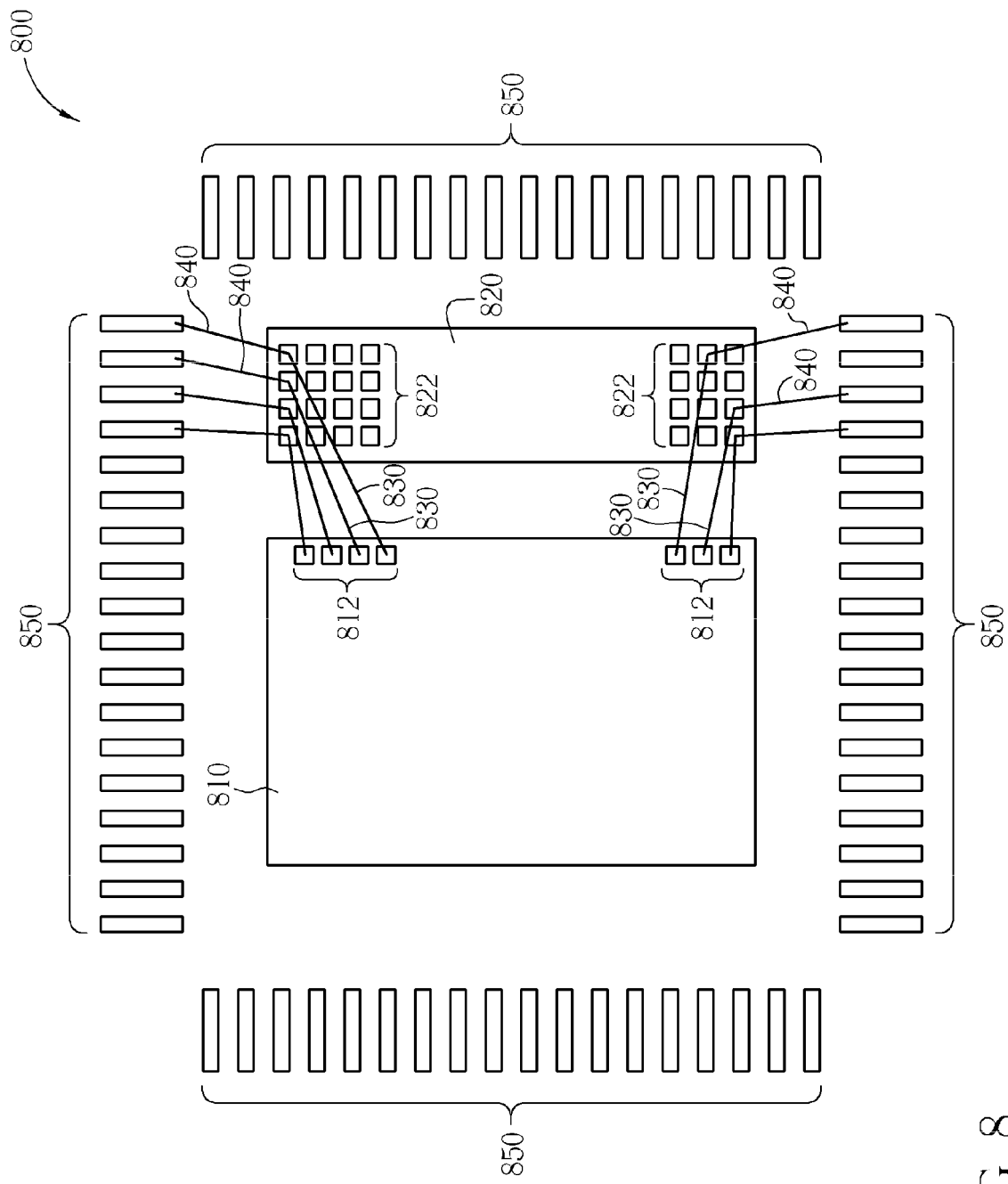
FIG. 8 is a diagram illustrating a semiconductor device assembly according to a ninth embodiment of the present invention.

Please refer to FIG. 8. FIG. 8 is a diagram illustrating a semiconductor device assembly 800 according to a ninth embodiment of the present invention. The semiconductor device assembly 800 includes two semiconductor dies 810 and 820, a plurality of first conductive elements 830, a plurality of second conductive elements 840, and a plurality of semiconductor package components 850. The semiconductor die 810 includes a plurality of bonding pads 812. The semiconductor die 820 includes a bonding pad module including a plurality of bonding pads 822 which may be or not be electrically connected to a die core of the semiconductor die 820 via any conductive trace within the semiconductor die 820 according to different applications. For example, for signals to jump between the semiconductor die 810 and the semiconductor package components 850, the bonding pads 822 may not be electrically connected to a die core of the semiconductor die 820.

In addition, each first conductive element 830 is coupled between the bonding pad 822 of the semiconductor die 820 and the bonding pad 812 of the semiconductor die 810. Each second conductive element 840 is coupled between the bonding pad 822 of the semiconductor die 820 and the semiconductor package component 850. Therefore, the bonding pads 812 can communicate with the semiconductor package components 850 by way of the bonding pads 822 of the semiconductor device 820. Thus the semiconductor die 810 may be coupled to the semiconductor package component 850 or another semiconductor die via the bonding pads 812 and the bonding pads 822 of the bonding pad module and the first and second conductive elements 830 and 840.

In a related art package method, the bonding pads of the semiconductor die are coupled to their corresponding semiconductor package components by wires. However, lengths of these wires or distances between two adjacent wires may not satisfy the routing rule, therefore, designs of the semiconductor dies may be more complex in order to satisfy the routing rule. In the semiconductor device assembly 800 of the present invention, the bonding pads 812 of the semiconductor die 810 can communicate with the semiconductor package components 850 byway of the semiconductor die 820, therefore, the designs of the semiconductor dies 810 and 820 are more flexible.

In addition, the semiconductor package components 850 can be leads of a lead frame or fingers of a ball grid array (BGA) substrate.

In addition, when the semiconductor device assembly 800 has different applications, (e.g., different specifications of TV or communication systems) the semiconductor dies 810 and 820 generally need to be re-designed several times to satisfy these different applications. In another embodiment of the present invention, the semiconductor die 820 can be designed to include common functions of all the applications. Therefore, only the semiconductor die 810 needs to be re-designed for different applications of the semiconductor device assembly 800. Furthermore, because the semiconductor die 820 includes the pads 822 for allowing the semiconductor die 810 to communicate with the semiconductor package elements 850, re-designation of the semiconductor device assembly 800 is faster and more efficient.

Figure 9:
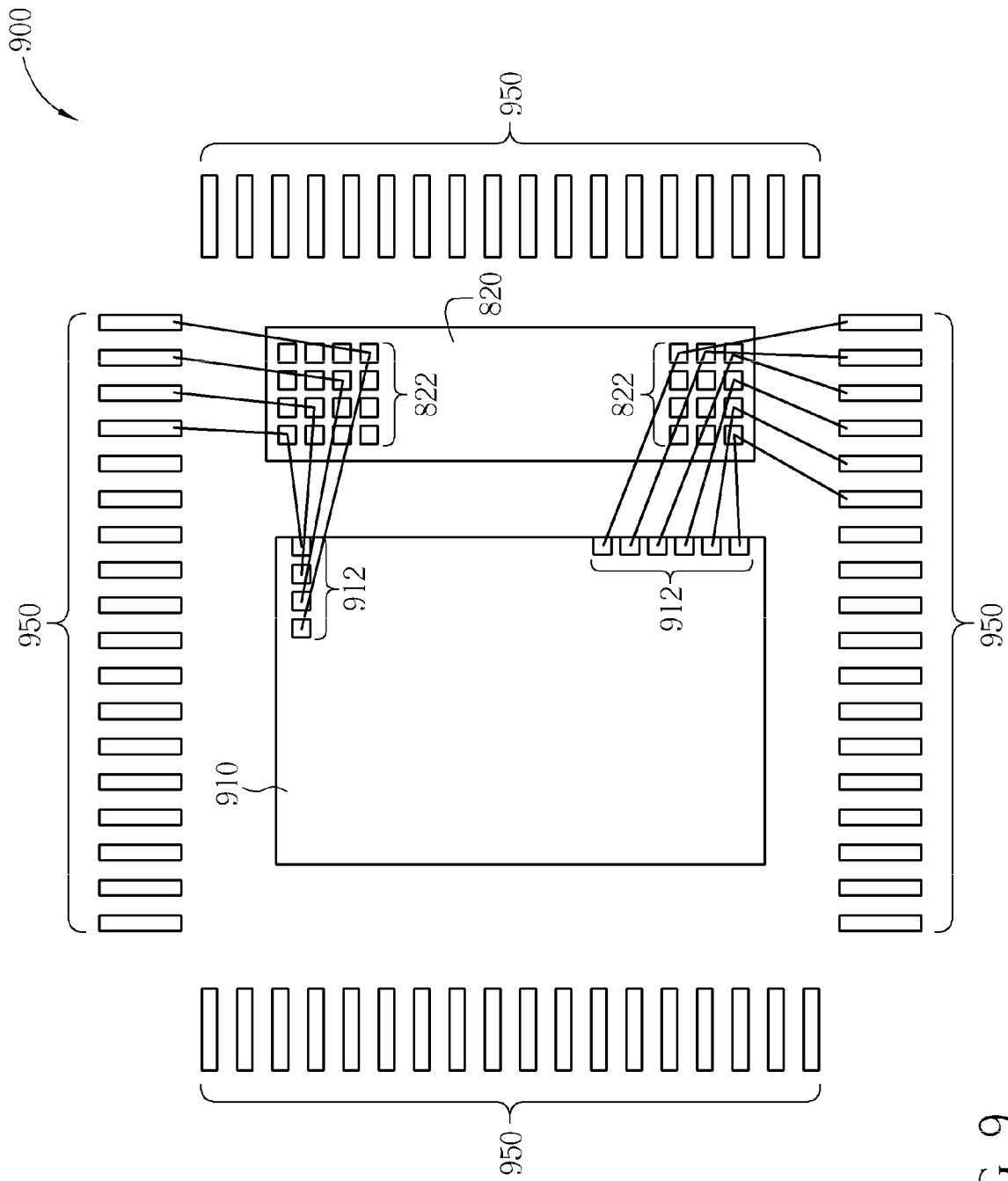
FIG. 9 is a diagram illustrating a semiconductor device assembly according to a tenth embodiment of the present invention.

FIG. 9 is a diagram illustrating a semiconductor device assembly 900 comprising the semiconductor die 820 shown in FIG. 8 according to a tenth embodiment of the present invention. As shown in FIG. 9, because the semiconductor die 820 does not need to be replaced, and because bonding pads 912 of a semiconductor die 910 can communicate with semiconductor package components 950 via the bonding pads 822 of the semiconductor die 820, design of the semiconductor device assembly 900 is more efficient.

In another embodiment of the present invention, one of the semiconductor dies 810 and 820 can be designed for executing digital signal processing and the other one can be designed for executing analog signal processing.

Figure 10:
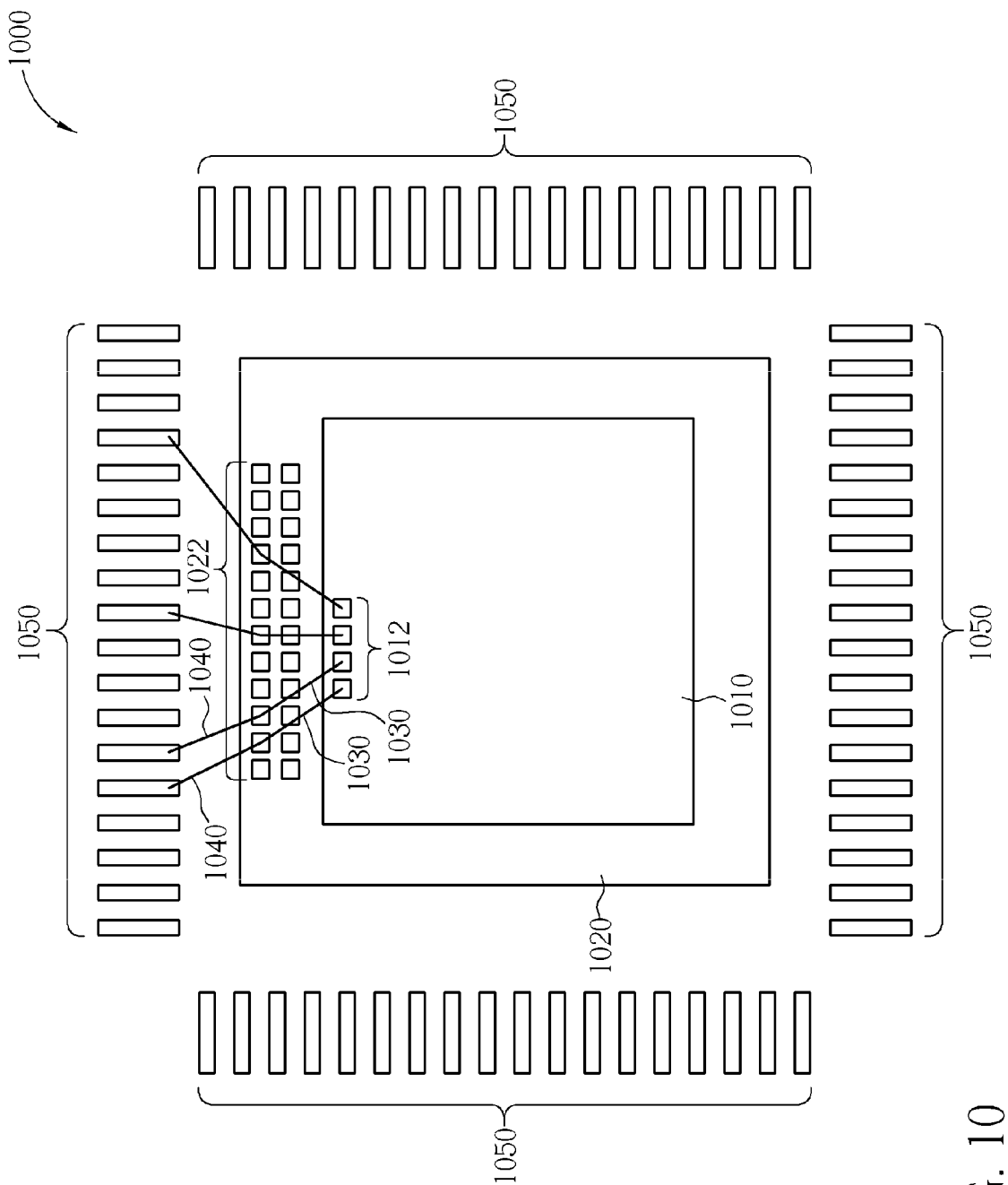
FIG. 10 is a diagram illustrating a semiconductor device assembly according to an eleventh embodiment of the present invention.

Please refer to FIG. 10. FIG. 10 is a diagram illustrating a semiconductor device assembly 1000 according to an eleventh embodiment of the present invention. The semiconductor device assembly 1000 includes two semiconductor dies 1010 and 1020, a plurality of first conductive elements 1030, a plurality of second conductive elements 1040, and a plurality of semiconductor package components 1050. The semiconductor die 1010 includes a plurality of bonding pads 1012. The semiconductor die 1020 includes a bonding pad module including plurality of bonding pads 1022 which may be or not be electrically connected to a die core of the semiconductor die 1020 via any conductive trace within the semiconductor die 1020 according to different applications. Furthermore, each first conductive element 1030 is coupled between the bonding pad 1022 of the semiconductor die 1020 and the bonding pad 1012 of the semiconductor die 1010, and each second conductive element 1040 is coupled between the bonding pad 1022 of the semiconductor die 1020 and the semiconductor package component 1050. In addition, the semiconductor die 1010 may be stacked on or over the semiconductor die 1020.

Figure 11:
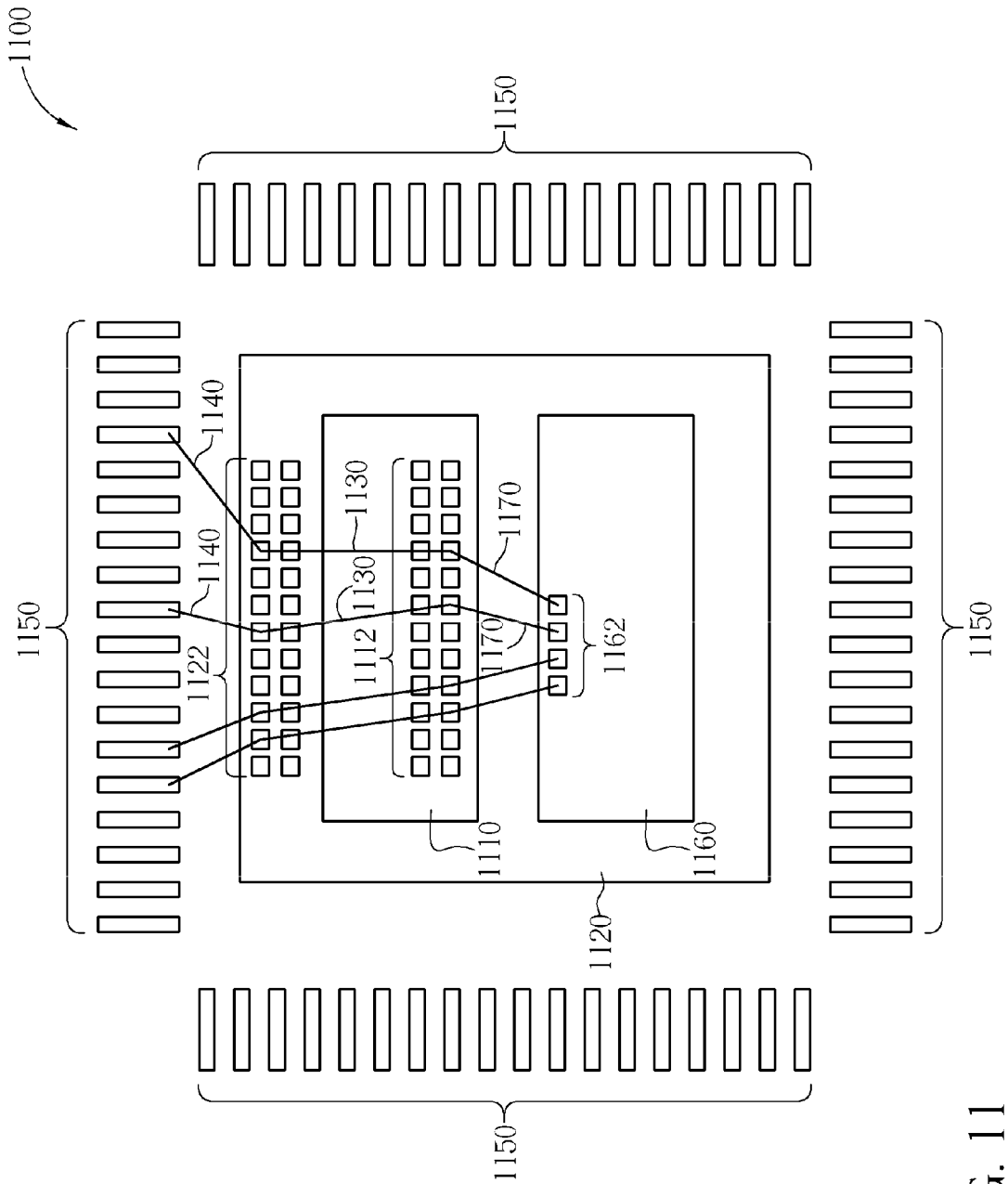
FIG. 11 is a diagram illustrating a semiconductor device assembly according to a twelfth embodiment of the present invention.

Please refer to FIG. 11. FIG. 11 is a diagram illustrating a semiconductor device assembly 1100 according to a twelfth embodiment of the present invention. The semiconductor device assembly 1100 includes three semiconductor dies 1110, 1120 and 1160, a plurality of first conductive elements 1130, a plurality of second conductive elements 1140, a plurality of third conductive elements 1170, and a plurality of semiconductor package components 1150. The semiconductor die 1110 includes a plurality of bonding pads 1112 which may be or not be electrically connected to a die core of the semiconductor die 1110 via any conductive trace within the semiconductor die 1110 according to different applications. The semiconductor die 1120 includes a bonding pad module including a plurality of bonding pads 1122 which may be or not be electrically connected to a die core of the semiconductor die 1120 via any conductive trace within the semiconductor die 1120 according to different applications. The semiconductor die 1160 includes a plurality of bonding pads 1162. In addition, the semiconductor dies 1110 and 1160 may be stacked on or over the semiconductor die 1120.

Each first conductive element 1130 is coupled between the bonding pad 1122 of the semiconductor die 1120 and the bonding pad 1112 of the semiconductor die 1110, each second conductive element 1140 is coupled between the bonding pad 1122 of the semiconductor die 1120 and the semiconductor package component 1150, and each third conductive element 1170 is coupled between the bonding pad 1112 of the semiconductor die 1110 and the bonding pad 1162 of the semiconductor die 1160. Therefore, the bonding pads 1162 can communicate with the semiconductor package components 1150 by way of the bonding pads 1112 and 1122.

Figure 12:
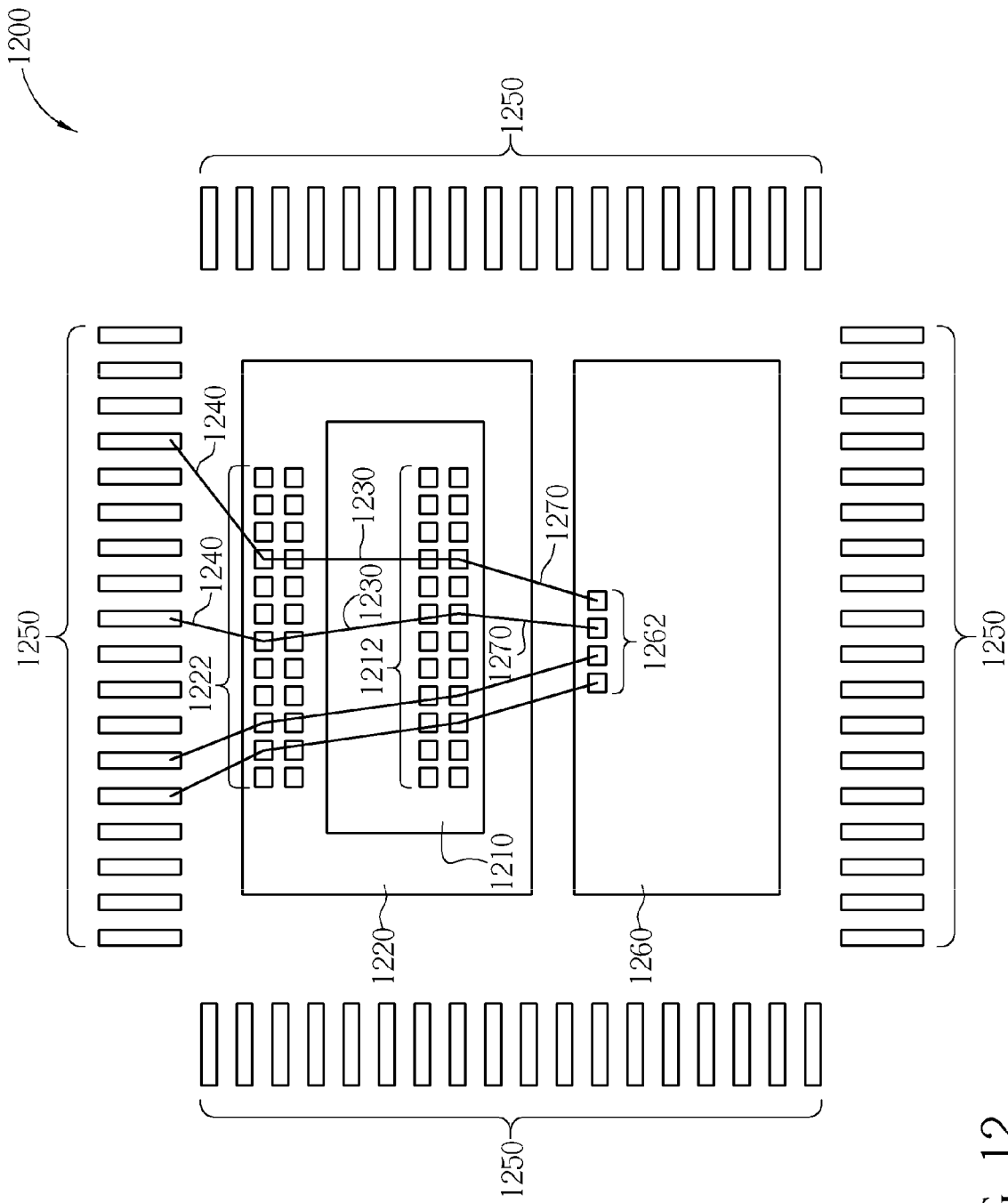
FIG. 12 is a diagram illustrating a semiconductor device assembly according to a thirteenth embodiment of the present invention.

Please refer to FIG. 12. FIG. 12 is a diagram illustrating a semiconductor device assembly 1200 according to a thirteenth embodiment of the present invention. The semiconductor device assembly 1200 includes three semiconductor dies 1210, 1220 and 1260, a plurality of first conductive elements 1230, a plurality of second conductive elements 1240, a plurality of third conductive elements 1270, and a plurality of semiconductor package components 1250. The semiconductor die 1210 includes a plurality of bonding pads 1212 which may be or not be electrically connected to a die core of the semiconductor die 1210 via any conductive trace within the semiconductor die 1210 according to different applications. The semiconductor die 1220 includes a bonding pad module including a plurality of bonding pads 1222 which may be or not be electrically connected to a die core of the semiconductor die 1220 via any conductive trace within the semiconductor die 1220 according to different applications. The semiconductor die 1260 includes a plurality of bonding pads 1262. In addition, the semiconductor die 1210 may be stacked on or over the semiconductor die 1220. It should be noted that the connections of the first, second and third conductive elements 1230, 1240 and 1270 may be similar to the conductive elements 1130, 1140 and 1170, therefore, further descriptions are omitted here.

Figure 13:
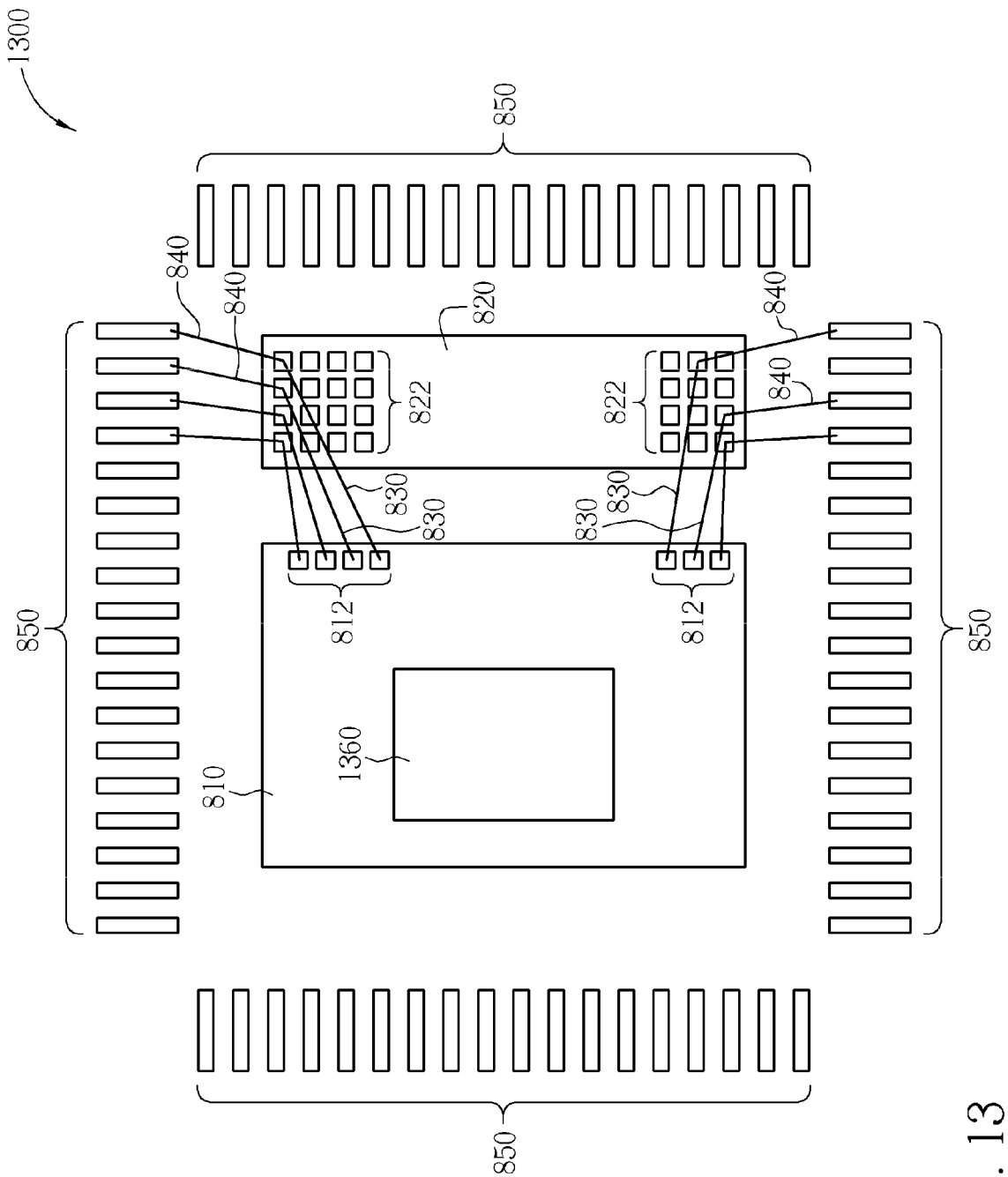
FIG. 13 is a diagram illustrating a semiconductor device assembly according to a fourteenth embodiment of the present invention.

FIG. 13 is a diagram illustrating a semiconductor device assembly 1300 according to a fourteenth embodiment of the present invention. Semiconductor device assembly 1300 is similar to the semiconductor device assembly 800 shown in FIG. 8 by adding a semiconductor die 1360 on or over the semiconductor die 810. In addition, in FIG. 13, the semiconductor die 1360 may be stacked on or over the semiconductor die 810, however, in other embodiment of the present invention, the semiconductor die 1360 can also be positioned under the semiconductor die 810.

In addition, in the semiconductor device assemblies 800-1300 shown in FIGS. 8-13, one bonding pad of the semiconductor die 810, 910, 1010, 1110 or 1210 is coupled to the semiconductor package component via only one bonding pad of the semiconductor die 820, 1020, 1120 or 1220. However, in other embodiments of the present invention, taking semiconductor device assembly 800 as an example, the one bonding pad 812 can be coupled to the semiconductor package component 850 via two or more bonding pads 822 of the semiconductor die 820. In addition, the bonding pads of the semiconductor die 820, 1020, 1120 and 1120 can have another shape rather than the rectangle shown in FIGS. 8-13.

It is noted that, in other embodiments, the semiconductor package components in the semiconductor device assemblies 800-1300 shown in FIGS. 8-13 can be replaced by another semiconductor die. Taking the device assembly 800 as an example, that is, the semiconductor die 810 may be coupled to the another semiconductor die via the bonding pad module of the semiconductor die 820.

Briefly summarized, in the semiconductor device assembly of the present invention, a semiconductor die can communicate with semiconductor package components or another semiconductor die via pads of the other semiconductor die. Therefore, routing between the semiconductor die and the semiconductor package components is easier, and the designs of the semiconductor dies are more flexible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device assembly, comprising:
    a first semiconductor die comprising at least one bonding pad;
    a second semiconductor die comprising a bonding pad module, wherein the bonding pad module of the second semiconductor die comprises a first bonding pad and a second bonding pad, and the first bonding pad is coupled to the second bonding pad by a conductive trace;
    at least one semiconductor package component or another semiconductor die;
    a first conductive element coupled between the first bonding pad of the bonding pad module of the second semiconductor die and the bonding pad of the first semiconductor die; and
    a second conductive element coupled between the second bonding pad of the bonding pad module of the second semiconductor die and the semiconductor package component or the another semiconductor die;
    wherein the first semiconductor die is coupled to the semiconductor package component or the another semiconductor die via the bonding pad and the bonding pad module and the first and second conductive elements.

2. The semiconductor device assembly of claim 1, wherein at least one boding pad in the bonding pad module is not electrically connected to a die core of the second semiconductor die via any conductive trace within the second semiconductor die.

3. The semiconductor device assembly of claim 1, wherein the first and second semiconductor dies are on or over a substrate, the first and second conductive elements are outside of the substrate.

4. The semiconductor device assembly of claim 1, wherein one of the first semiconductor die and the second semiconductor die is utilized for executing digital signal processing, and the other of the first semiconductor die and the second semiconductor die is utilized for executing analog signal processing.

5. The semiconductor device assembly of claim 1, wherein the semiconductor package component is a lead of a lead frame.

6. The semiconductor device assembly of claim 1, wherein the semiconductor package component is a finger of a ball grid array (BGA) substrate.

7. The semiconductor device assembly of claim 1, wherein one of the first and second semiconductor dies is stacked on or over the other of the first and second semiconductor dies.

8. The semiconductor device assembly of claim 1, further comprising a third semiconductor die on, over or under the second semiconductor die.

9. The semiconductor device assembly of claim 1, further comprising a third semiconductor die on, over or under the first semiconductor die.

10. The semiconductor device assembly of claim 1, further comprises:
    a third semiconductor die, comprising at least one bonding pad; and
    a third conductive element, coupled between the bonding pad of the first semiconductor die and the bonding pad of the third semiconductor die.

11. The semiconductor device assembly of claim 10, wherein one of the first and second semiconductor dies is stacked on or over the other of the first and second semiconductor dies.

12. The semiconductor device assembly of claim 10, wherein the third semiconductor die is on, over or under the second semiconductor die.

13. The semiconductor device assembly of claim 10, wherein the third semiconductor die is on, over or under the first semiconductor die.

14. A semiconductor device assembly, comprising:
   a first semiconductor die comprising at least one bonding pad;
   a second semiconductor die comprising a bonding pad module, wherein at least one boding pad in the bonding pad module is not electrically connected to a die core of the second semiconductor die via any conductive trace within the second semiconductor die;
   at least one semiconductor package component or another semiconductor die;
   a first conductive element coupled between the bonding pad module of the second semiconductor die and the bonding pad of the first semiconductor die; and
   a second conductive element coupled between the bonding pad module of the second semiconductor die and the semiconductor package component or the another semiconductor die;
   wherein the first semiconductor die is coupled to the semiconductor package component or the another semiconductor die via the bonding pad and the bonding pad module and the first and second conductive elements.

15. A semiconductor device assembly, comprising:
   a first semiconductor die comprising at least one bonding pad;
   a second semiconductor die comprising a bonding pad module;
   at least one semiconductor package component or another semiconductor die;
   a first conductive element coupled between the bonding pad module of the second semiconductor die and the bonding pad of the first semiconductor die; and
   a second conductive element coupled between the bonding pad module of the second semiconductor die and the semiconductor package component or the another semiconductor die;
   wherein the first semiconductor die is coupled to the semiconductor package component or the another semiconductor die via the bonding pad and the bonding pad module and the first and second conductive elements, and the first and second semiconductor dies are positioned side-by-side on or over a substrate.

* * * * *